US006760742B1

(12) United States Patent
Hoyle

(10) Patent No.: US 6,760,742 B1
(45) Date of Patent: Jul. 6, 2004

(54) MULTI-DIMENSIONAL GALOIS FIELD MULTIPLIER

(75) Inventor: David Hoyle, Glendale, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/507,187

(22) Filed: Feb. 18, 2000

(51) Int. Cl.[7] ............................................. G06F 15/00
(52) U.S. Cl. ...................................................... 708/492
(58) Field of Search ............................... 708/492, 625, 708/653

(56) References Cited

U.S. PATENT DOCUMENTS

| | | | |
|---|---|---|---|
| 4,037,093 A | | 7/1977 | Gregg et al. |
| 4,165,444 A | | 8/1979 | Gordon |
| 4,847,801 A | | 7/1989 | Tong |
| 4,852,098 A | | 7/1989 | Brechard et al. |
| 4,918,638 A | | 4/1990 | Matsumoto et al. |
| 5,046,037 A | | 9/1991 | Cognault et al. |
| 5,107,503 A | | 4/1992 | Riggle et al. |
| 5,272,661 A | * | 12/1993 | Raghavan et al. ........... 708/492 |
| 5,502,665 A | * | 3/1996 | Im ............................... 708/492 |
| 5,535,225 A | | 7/1996 | Mayhew et al. |
| 5,537,426 A | | 7/1996 | Lee |
| 5,602,767 A | * | 2/1997 | Fettweis et al. ............. 708/492 |
| 5,768,168 A | * | 6/1998 | Im ............................... 708/492 |
| 5,787,099 A | | 7/1998 | Lan et al. |
| 5,818,855 A | | 10/1998 | Foxcroft |
| 5,999,959 A | | 12/1999 | Weng et al. |
| 6,366,941 B1 | * | 4/2002 | Wolf et al. .................. 708/492 |

* cited by examiner

Primary Examiner—Kakali Chaki
Assistant Examiner—Chat Do
(74) Attorney, Agent, or Firm—Robert D. Marshall, Jr.; W. James Brady, III; Frederick J. Telecky, Jr.

(57) ABSTRACT

An implementation of a multi-dimensional Galois field multiplier and a method of Galois field multi-dimensional multiplication which are able to support many communication standards having various symbol sizes, different GFs, and different primitive polynomials, in a cost-efficient manner is disclosed. The key to allow a single implementation to perform for all different GF sizes is to align the input data such that the Galois field symbols of the operands are aligned to the left most significant bit (MSB) position of the input data field. Similarly, the primitive polynomial used to create a selected Galois field is aligned to the left MSB position. A polynomial multiply is performed. The product polynomial is then conditionally divided by the primitive polynomial starting with the most significant bit, the condition being if the left most bit of the product is a 1. In other words, if the product polynomial has an MSB of 1, then divide the product with the primitive polynomial. Perform this step until the MSB is 0. In addition, for fields smaller than a maximum size Galois field, the sequence of conditional divisions is further conditioned with a predetermined mask in dependence upon the size of the GF. The resultant product is aligned to the left MSB.

13 Claims, 6 Drawing Sheets

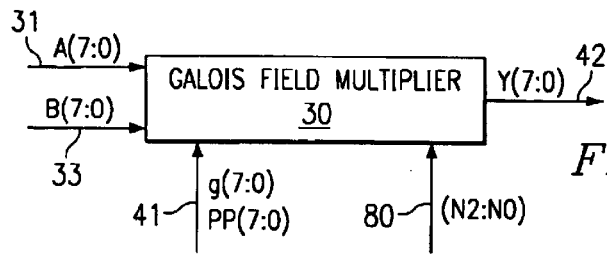
FIG. 2
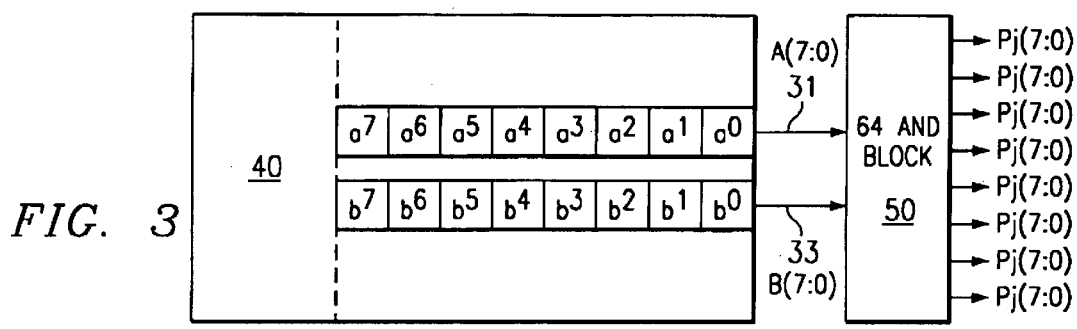
FIG. 3
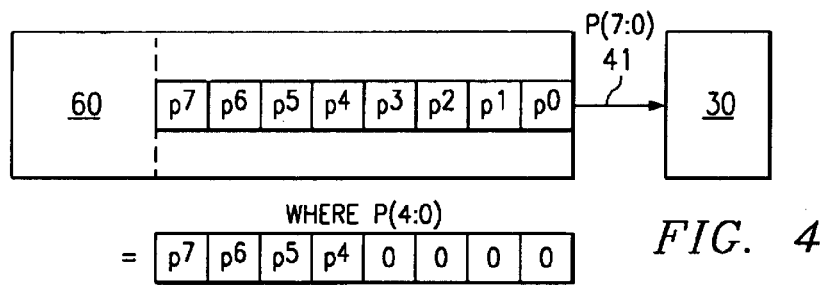
FIG. 4
FIG. 7

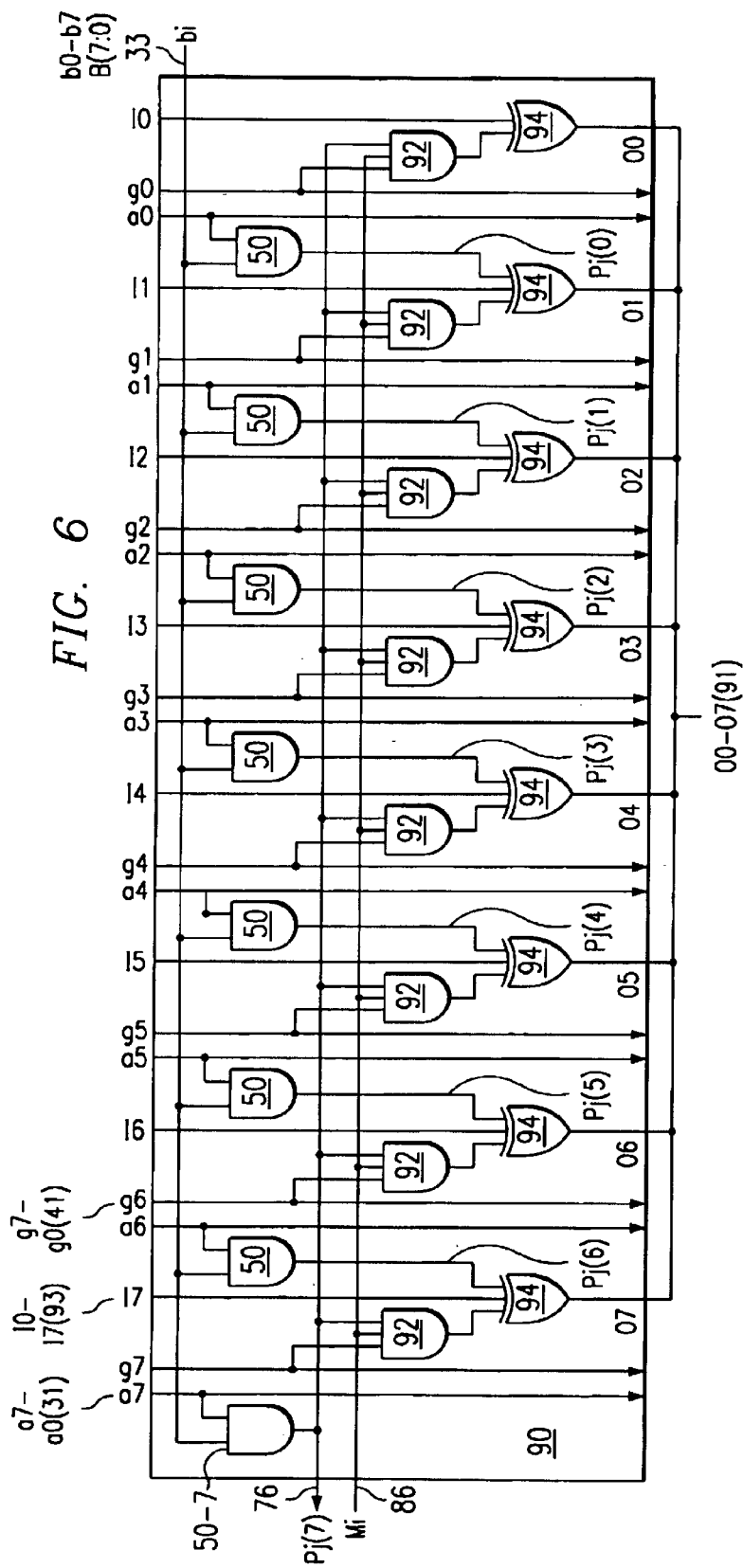

| fsz | mask_gen |
|-----|----------|
| 111 | 11111111 |
| 110 | 11111110 |
| 101 | 11111100 |
| 100 | 11111000 |
| 011 | 11110000 |
| 010 | 11100000 |
| 001 | 11000000 |
| 000 | 10000000 |

*FIG. 8A*

```
                                         For m = 7
                              a7 a6 a5 a4 a3 a2 a1 a0
                            *  b7 b6 b5 b4 b3 b2 b1 b0
                              ----------------------------
                           = a7 &  b7 b6 b5 b4 b3 b2 b1 b0
                          a6 &  b7 b6 b5 b4 b3 b2 b1 b0
                       a5 &  b7 b6 b5 b4 b3 b2 b1 b0
                    a4 &  b7 b6 b5 b4 b3 b2 b1 b0
                 a3 &  b7 b6 b5 b4 b3 b2 b1 b0
              a2 &  b7 b6 b5 b4 b3 b2 b1 b0
           a1 &  b7 b6 b5 b4 b3 b2 b1 b0
        a0 &  b7 b6 b5 b4 b3 b2 b1 b0
           ------------------------------
           => ce cd cc cb ca c9 c8 c7 c6 c5 c4 c3 c2 c1 c0
    '1'      1 g7 g6 g5 g4 g3 g2 g1 g0
    '1'         1 g7 g6 g5 g4 g3 g2 g1 g0
    '1'            1 g7 g6 g5 g4 g3 g2 g1 g0
    '1'               1 g7 g6 g5 g4 g3 g2 g1 g0
    '1'                  1 g7 g6 g5 g4 g3 g2 g1 g0
    '1'                     1 g7 g6 g5 g4 g3 g2 g1 g0
    '1'                        1 g7 g6 g5 g4 g3 g2 g1 g0
                            >>  (7 - m)
```

*FIG. 8B*

```
                                         For m = 4
                              a7 a6 a5 a4  0  0  0  0
                            *  b7 b6 b5 b4  0  0  0  0
                              ----------------------------
                           =  0 &  b7 b6 b5 b4  0  0  0  0
                          0 &  b7 b6 b5 b4  0  0  0  0
                       0 &  b7 b6 b5 b4  0  0  0  0
                    0 &  b7 b6 b5 b4  0  0  0  0
                 a4 &  b7 b6 b5 b4  0  0  0  0
              a5 &  b7 b6 b5 b4  0  0  0  0
           a6 &  b7 b6 b5 b4  0  0  0  0
        a7 &  b7 b6 b5 b4  0  0  0  0
           ------------------------------
           => ce cd cc cb ca c9 c8 c7  0  0  0  0  0  0  0
  +=>  '1'    1 g7 g6 g5 g4  0  0  0
  +=>  '1'       1 g7 g6 g5 g4  0  0  0
  +=>  '1'          1 g7 g6 g5 g4  0  0  0
  +=>  '1'             1 g7 g6 g5 g4  0  0  0
  +=>  '0'                0  0  0  0  0  0  0
  +=>  '0'                   0  0  0  0  0  0  0
  +=>  '0'                      0  0  0  0  0  0  0
                          d7 d6 d5 d4  0  0  0  0  0  0
                           >>  3 = (7 - m)
                          d7 d6 d5 d4  0  0  0  0
```

MULTI-DIMENSIONAL GALOIS FIELD MULTIPLIER

FIELD OF THE INVENTION

This invention relates in general to Galois Field arithmetic and more specifically to a single implementation of a multi-dimensional Galois Field multiplier.

BACKGROUND OF THE INVENTION

Galois Field arithmetic finds application in error correcting codes, particularly Reed Solomon Codes and cryptographic codes.

Galois Field arithmetic is a cyclic finite field arithmetic such that any operation performed on any two numbers within the field, yields a number in the field, i.e. there is no operation which can be done on any two numbers within the field which yields a number outside of the field. Finite field arithmetic uses real numbers that consist of the range of numbers shown in Table 1 below. For example, the range of integers from 0 to 7 (0,1,2,3,4,5,6,7) has a Galois Field representation or notation of GF(8) because the Galois Field has 8 elements, while the range of integers 0 to 1 has a Galois Field of GF(2) because it has only two elements, etc. In addition, digital systems transmit data in bits. Because bits are binary, they can only take on one of two values, either a 0 or a 1. Grouping these bits together to build a symbol is common in digital systems. These groupings are all based on a power of two. Table 1 lists the digital symbols vs. GF notation.

TABLE 1

Digital symbols vs. GF notation

| Number of bits per symbol | Range of integers | GF notation |
|---|---|---|
| 1 | 0 to 1 | GF(2) |
| 2 | 0 to 3 | GF(4) |
| 3 | 0 to 7 | GF(8) |
| 4 | 0 to 15 | GF(16) |
| 5 | 0 to 31 | GF(32) |
| 6 | 0 to 63 | GF(64) |
| 7 | 0 to 127 | GF(128) |
| 8 | 0 to 255 | GF(256) |

There are several ways of representing the numbers in the finite field of any given Galois Field. For example, the data shown on Table 2 illustrates the integer, binary and polynomial representations of the numbers of GF(8).

TABLE 2

Representations of Galois Field GF(8)

| Integer | Binary | Polynomial |
|---|---|---|
| 0 | 000 | 0 |
| 1 | 001 | 1 |
| 2 | 010 | x |
| 3 | 011 | x + 1 |
| 4 | 100 | $x^2$ |
| 5 | 101 | $x^2 + 1$ |
| 6 | 110 | $x^2 + x$ |
| 7 | 111 | $x^2 + x + 1$ |

In addition, each Galois Field has one or more primitive polynomials, or generator polynomials, which is analogous to a particular set of consecutive real integers which also has one or more prime numbers, depending upon how large is the particular set of consecutive integers. Primitive polynomials, p(x), g(x) are polynomials which are used to define the arithmetic functions for each field. For example, in Galois Field arithmetic, like arithmetic, certain mathematical properties exist such as laws of commutativity, associativity, etc. Therefore, when determining what is the sum or product of any two elements within a Galois Field, if after applying such laws, the sum or product will lie outside the Galois Field, that sum or product is divided by a predetermined primitive polynomial. In this way, the Galois Field is preserved. Table 3 lists the integer representation of all the primitive polynomials for GF(8) to GF(256).

TABLE 3

Primitive Polynomials for Various Galois Fields

| GF(x) | P(x) | GF(x) | P(x) | GF(x) | P(x) |
|---|---|---|---|---|---|
| 8 | 11 | 128 | 137 | 256 | 285 |
| 16 | 19 | 128 | 143 | 256 | 361 |
| 32 | 37 | 128 | 157 | 256 | 487 |
| 32 | 61 | 128 | 247 | 256 | 299 |
| 32 | 55 | 128 | 191 | 256 | 357 |
| 64 | 67 | 128 | 213 | 256 | 355 |
| 64 | 103 | 128 | 131 | 256 | 351 |
| 64 | 109 | 128 | 203 | 256 | 451 |
|  |  | 128 | 229 |  |  |

As can be seen from the above table, there is only one primitive polynomial for GF(8) and GF(16), due to the smallness of the field, however, GF(128) has 9 primitive polynomials and GF(256) has 8 primitive polynomials. As mentioned previously, each of these integer representations has a corresponding polynomial representation. For example, one primitive polynomial, p(x) for GF(256) is 285, which corresponds to $p(x)=x^8+x^4+x^3+X^2+1$.

Multiplication in finite fields is easily computed using the polynomial format. For the following examples, GF(8) and $p(x)=x^3+x+1$ are used to build the multiplication Tables 4 and 5. The primitive polynomial is used to reduce or 'fold' the product or on results back into the field. For example:

$$x^2 * x^2 = x^4$$

where $x^4$ is not a member of the GF(8) field. The primitive polynomial, p(x), is then used in a polynomial division to generate the remainder of:

$$x^4/p(x)=x^4/x^3+x+1=x^2+x$$

The same primitive polynomial is used to generate the entire multiplication table per GF, even if more than one primitive polynomial exists for a particular GF.

TABLE 4

GF(8), p(x) = $x^3$ + x + 1, Multiplication Example Part 1.

| X | 0 | 1 | X | x + 1 | $x^2$ | $x^2$ + 1 | $x^2$ + x | $x^2$ + x + 1 |
|---|---|---|---|---|---|---|---|---|
| 0 | 0 | 0 | 0 | 0 | 0 | 0 | 0 | 0 |
| 1 | 0 | 1 | X | x + 1 | $x^2$ | $x^2$ + 1 | $x^2$ + x | $x^2$ + x + 1 |
| x | 0 | x | $x^2$ | $x^2$ + x | x + 1 | 1 | $x^2$ + x + 1 | $x^2$ + 1 |
| x + 1 | 0 | x + 1 | $x^2$ + x | $x^2$ + 1 | $x^2$ + x + 1 | $x^2$ | 1 | x |
| $x^2$ | 0 | $x^2$ | x + 1 | $x^2$ + x + 1 | $x^2$ + x | x | $x^2$ + 1 | 1 |
| $x^2$ + 1 | 0 | $x^2$ + 1 | 1 | $x^2$ | X | $x^2$ + x + 1 | x + 1 | $x^2$ + x |
| $x^2$ + x | 0 | $x^2$ + x | $x^2$ + x + 1 | 1 | $x^2$ + 1 | x + 1 | x | $x^2$ |
| $x^2$ + x + 1 | 0 | $x^2$ + x + 1 | $x^2$ + 1 | x | 1 | $x^2$ + x | $x^2$ | x + 1 |

Another way of representing Table 4 is in binary as shown in Table 5, below:

TABLE 5

GF(8), p(x) = 1011, Multiplication Example Part 2.

| * | 000 | 001 | 010 | 011 | 100 | 101 | 110 | 111 |
|---|---|---|---|---|---|---|---|---|
| 000 | 000 | 000 | 000 | 000 | 000 | 000 | 000 | 000 |
| 001 | 000 | 001 | 010 | 011 | 100 | 101 | 110 | 111 |
| 010 | 000 | 010 | 100 | 110 | 011 | 001 | 111 | 101 |
| 011 | 000 | 011 | 110 | 101 | 111 | 100 | 001 | 010 |
| 100 | 000 | 100 | 011 | 111 | 110 | 101 | 101 | 001 |
| 101 | 000 | 101 | 001 | 100 | 010 | 111 | 011 | 110 |
| 110 | 000 | 110 | 111 | 001 | 101 | 011 | 010 | 100 |
| 111 | 000 | 111 | 101 | 010 | 001 | 110 | 100 | 011 |

Notice how each entry occurs once in each row or column. This set of numbers forms a field. The field has an identity of 001 and each entry in the field has an inverse (except zero) such that (a*inv a)=001. Because every element has in inverse, this group is called a field. The tables below illustrate the inverse in binary of GF(8), and then addition and subtraction tables for GF(8).

TABLE 6

Inverse of GF(8)

| a | Inv(a) |
|---|---|
| 000 | NULL |
| 001 | 001 |
| 010 | 101 |
| 011 | 110 |
| 100 | 111 |
| 101 | 010 |
| 110 | 011 |
| 111 | 100 |

Similarly under addition, GF(8) using the same primitive polynomial 1011 is:

TABLE 7

GF(8), p(x) = 1011, addition

| + | 000 | 001 | 010 | 011 | 100 | 101 | 110 | 111 |
|---|---|---|---|---|---|---|---|---|
| 000 | 000 | 001 | 010 | 011 | 100 | 101 | 110 | 111 |
| 001 | 001 | 000 | 011 | 010 | 101 | 100 | 111 | 110 |
| 010 | 010 | 011 | 000 | 001 | 110 | 111 | 100 | 101 |
| 011 | 011 | 010 | 001 | 000 | 111 | 110 | 101 | 100 |
| 100 | 100 | 101 | 110 | 111 | 000 | 001 | 010 | 011 |
| 101 | 101 | 100 | 111 | 110 | 001 | 000 | 011 | 010 |
| 110 | 110 | 111 | 100 | 101 | 010 | 011 | 000 | 001 |
| 111 | 111 | 110 | 101 | 100 | 011 | 010 | 001 | 000 |

TABLE 8

GF(8), p(x) = 1011, subtraction

| − | 000 | 001 | 010 | 011 | 100 | 101 | 110 | 111 |
|---|---|---|---|---|---|---|---|---|
| 000 | 000 | 001 | 010 | 011 | 100 | 101 | 110 | 111 |
| 001 | 001 | 000 | 011 | 010 | 101 | 100 | 111 | 110 |
| 010 | 010 | 011 | 000 | 001 | 110 | 111 | 100 | 101 |
| 011 | 011 | 010 | 001 | 000 | 111 | 110 | 101 | 100 |
| 100 | 100 | 101 | 110 | 111 | 000 | 001 | 010 | 011 |
| 101 | 101 | 100 | 111 | 110 | 001 | 000 | 011 | 010 |
| 110 | 110 | 111 | 100 | 101 | 010 | 011 | 000 | 001 |
| 111 | 111 | 110 | 101 | 100 | 011 | 010 | 001 | 000 |

For addition and subtraction in GF(8), inspection determines that the elements of both Galois fields are identical and the operation is actually an Exclusive OR or XOR logic function. Again there is an identity element of 000 and each element has an inverse under addition/subtraction. As is illustrated in Table 9 below, all elements self-inverse under addition and subtraction.

TABLE 9

Inversion over + and − in GF(8)

| A | Inv(a) |
|---|---|
| 000 | 000 |
| 001 | 001 |
| 010 | 010 |
| 011 | 011 |
| 100 | 100 |
| 101 | 101 |
| 110 | 110 |
| 111 | 111 |

As is illustrated in the previous binary GF(8) example, implementation of the add and subtract is trivial in a general purpose microprocessor, but the multiplication operator is a non-standard element in both general purpose processors and digital signal processors alike. The algorithm to perform multiplication in Galois field arithmetic is now described. Step 1: Perform polynomial (carryless) multiply of the two elements. Field size N elements produce a 2N−1 degree polynomial (which doesn't fit in the field of N size elements), so, must perform Step 2: the result of the multiply is divided by the primitive polynomial and the remainder is the final answer. Step 2 has the following sub-parts: 1) Use the Most Significant Bit (MSB) of the result to determine whether to subtract (XOR) the primitive polynomial, P or not; and 2) Repeat the conditional subtract until the MSB of the result is in position N−1 or less (for a Galois field size of N). The above described Galois field multiply is illustrated in FIG. 1. As shown, first the two operands A(4:0) 32 and B(4:0) 34, of GF size GF(16), perform a polynomial multiply and yield a product 1000101 35. Because the MSB of the product 35 is a "1", a division of the product by the primitive polynomial or generator polynomial 36 is performed yielding the "remainder" 38. Because, after the first conditional subtraction (XOR), the "remainder" 38 does not fit in a GF(16), another conditional subtraction is performed, yielding a remainder of the size of GF(16) which is the final result 39.

Galois Field (GF) multiplication is an important and necessary function, i.e. performed many times, in Reed-Solomon (RS) codes. RS codes are used in many communication applications such as satellites, modems, audio compact disks, and set-top boxes as a digital data transmission forward error correction tool. Each one of these applications has a different standard. Each standard defines a symbol size, a GF, and a primitive polynomial (generator polynomial). Each application requires a unique GF multiplier or a GF multiplier which has a unique configuration to be created which will at least depend on the symbol size, the size of the Galois Field and the primitive polynomial used. There has never been a GF multiplier which could implement all the different standards in a cost efficient manner.

SUMMARY OF THE INVENTION

An implementation of a multi-dimensional Galois Field multiplier for Galois Fields from a GF(1) up to a GF(256) is disclosed. This GF multiplier is able to support many different communication standards such as standards with different symbol sizes, different GFs, and different primitive polynomials. The key to allow a single implementation of a GF multiplier to perform for all different GF sizes is to align the input data such that the MSB is aligned to bit 7 in the GF(256) input data field. A polynomial multiply of the two input operands is performed. The product polynomial is then conditionally XORed with the primitive polynomial starting with the most significant bit, the condition being if the left most bit of the product being 1. In other words, if the product polynomial has a MSB of 1, then XOR the product with the primitive polynomial. The result of the division with the primitive polynomial yields a remainder. Perform this division by the primitive polynomial step until the condition is not satisfied or until the MSB is 0. In addition, for fields smaller than GF(256), the sequence of conditional XORs has to be ANDed with the a predetermined mask in dependence upon the size of the GF. The field polynomial is aligned left and the result is also aligned left.

BRIEF DESCRIPTION OF THE DRAWINGS

FIG. 2 illustrates the top-level block diagram of a Galois Field Multiplier according to a preferred embodiment of the invention.

FIG. 3 illustrates a block diagram of the manner in which operands A and B are stored in memory and a 64 AND block according to a preferred embodiment of the invention.

FIG. 4 illustrates a block diagram of a memory circuit in which the primitive polynomial, p(x) is stored aligned to the left or to the MSB position of the primitive polynomial input to the BASIC XOR blocks illustrated in FIGS. 5 and 6.

FIG. 6 illustrates the schematic diagram of the BASIC XOR BLOCK of FIG. 5 according to a preferred embodiment of the invention.

FIG. 7 illustrates the mask input, $M_I$ 86 associated with each size Galois field according to a preferred embodiment of the invention.

FIG. 8A illustrates the data flow diagram of a Galois field multiply where the GF size is GF(256) according to a preferred embodiment of the invention.

FIG. 8B illustrates the data flow diagram of a Galois field multiply where the GF size is GF(16) according to a preferred embodiment of the invention.

FIG. 9 illustrates the data flow diagram of a Galois field multiply instruction according to a preferred embodiment on the invention.

DETAILED DESCRIPTION OF THE PREFERRED EMBODIMENTS

Figure 1:
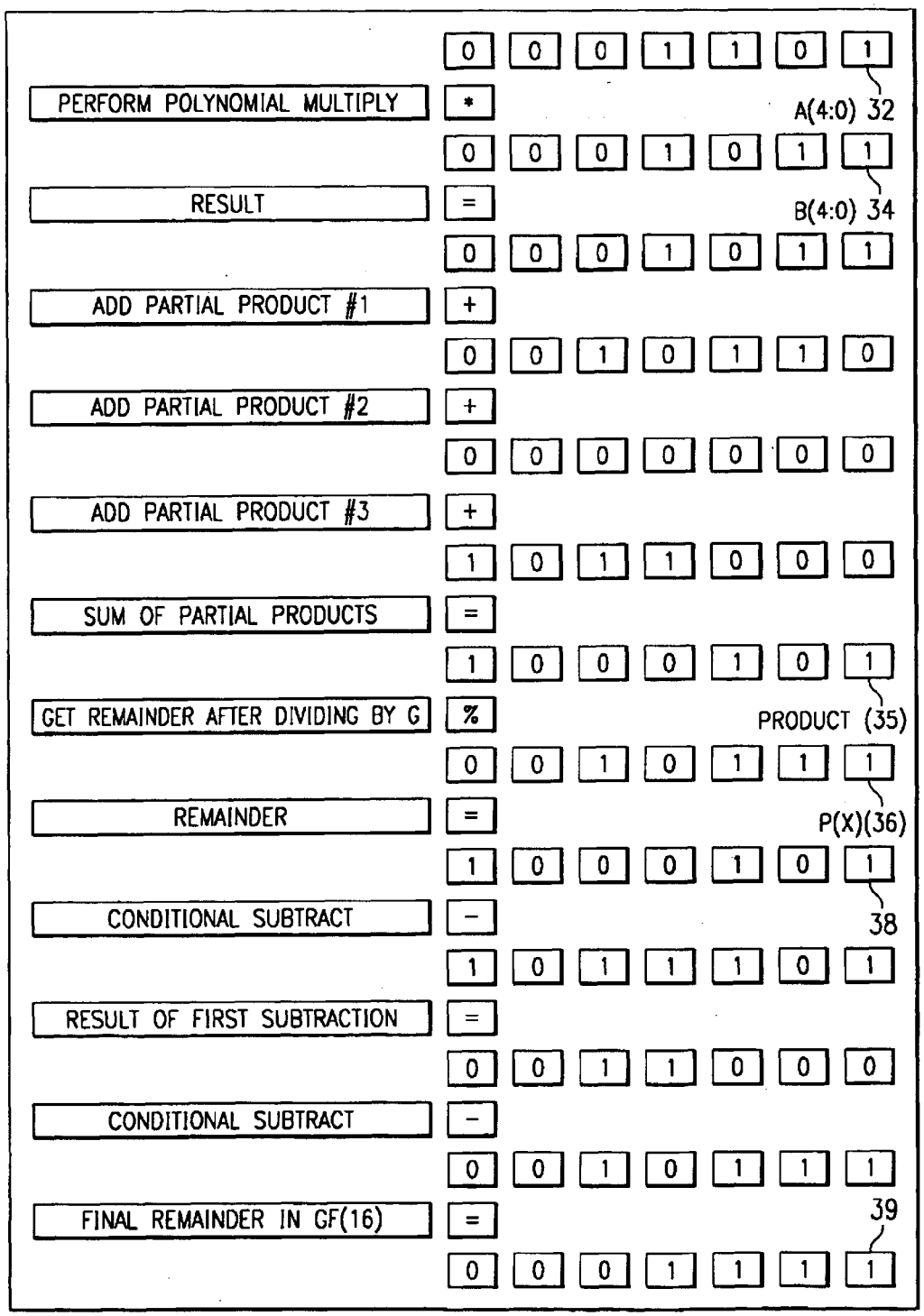
FIG. 1 illustrates an example of a Galois field multiply in GF(16).

A Galois Field multiplier is disclosed which works for all 25 primitive polynomials listed in Table 3 and for all GFs between 2 and 256. Therefore, an implementation of the GF multiplier must be able to compute the GF multiplication with any p(x) for a particular GF, labeled as PP(7:0) 41, and particular GF 80 as inputs as well as the A and B operands 31,33, which will be elements within the particular GF. The top-level block is shown in FIG. 2.

FIG. 3 illustrates a block diagram of the manner in which operands A and B 31,33 are stored in memory 40 such that they are presented to the input of the multiplier 30 (shown as the AND blocks of FIG. 3) starting at the MSB of the input of the multiplier. The A and B operands 31,33, in this exemplary example, must be stored in memory such that the left most occupied bit of the operand fills the input MSB position. Depending on the relative size of the GF, zeros may be filling a LSB portion of each input to the multiplier. In other words, when data comes in a continuous stream, instead of filling the memory from LSB to MSB, filing the memory from MSB to LSB results in all the input operands being aligned to the left or the MSB of the input to the multiplier. For GF(256), each operand, A and B 31,33, is 8 bits and with 8 bits coming out of the multiplier, no zeros padding the LSB positions of the input are necessary. For GF(128), which corresponds to 7 bit operands, B(6:0) is stored as B(7:0) with one zero padding the LSB position of the input, because we are inputting 7 bits and getting 8 bits out. For GF(64), corresponding to 6 bit operands, B(5:0) is again stored as B(7:0) with two zero padding (the two LSB positions of the input bit positions 0 and 1 are set to zeros). This pattern of storing the A and B operands in memory is performed for all the other fields in the same manner. There are also major advantages to performing the storing operation of the input operands A and B at the operand level, to storing the aligned to the left primitive polynomial at the primitive polynomial level and finally to shifting the output at the output of the BASIC XOR block, versus the alternative of performing shifting operations at each and every BASIC XOR block such as shown in FIG. 6. By performing the storing operations at the former points within the multiplier, a smaller and less complex multiplier results due to the fewer shifts that will have to be performed.

FIG. 3 also illustrates the block diagram of the 64 AND blocks 50. This block contains 64 AND gates. Every possible combination of A(7:0) and B(7:0) are ANDed together. $P_7$ (7:0) is the output of ANDing B(7) with all 8 signals of A(7:0). $P_6$(7:0) is the output of the ANDing of B(6) with all 8 signals of A(7:0). This pattern of ANDing continues for B5, B4, B3, B2, B1 and B0, yielding $P_j$(7:0) outputs which become an intermediate product for use in a later step as shown in FIG. 6.

Independently, the primitive polynomial PP7:0) 41 has been shifted to the left-most position and stored in memory as such as illustrated in the block diagram of the memory 60 of FIG. 4. The primitive polynomial 41 is shifted up by the user before passing the primitive polynomial on to the multiplier, or in other words, the primitive polynomial is defined as the shifted version and presented to the Galois field multiplier for use in the BASIC XOR block as so, i.e. if the primitive polynomial is $X^4+X^2+1$, according to a preferred embodiment of the invention, the primitive polynomial presented to the Galois field multiplier would be $X^4$ $(X^4+X^2+1)$ resulting in a primitive polynomial input of $X^8+X^6+X^4$. Zeros may comprise a LSB portion of each primitive polynomial input to the BASIC XOR in dependence upon the number of bits the primitive polynomial comprises as compared to the number of bits within the GF as disclosed and explained in the A and B operand storing operation shown in FIG. 3. This storing function yields P(7:0) 41 which like A(7:0) 31, become inputs to a later step shown in FIG. 5. This block is also implemented with multiplexers.

Figure 5A:
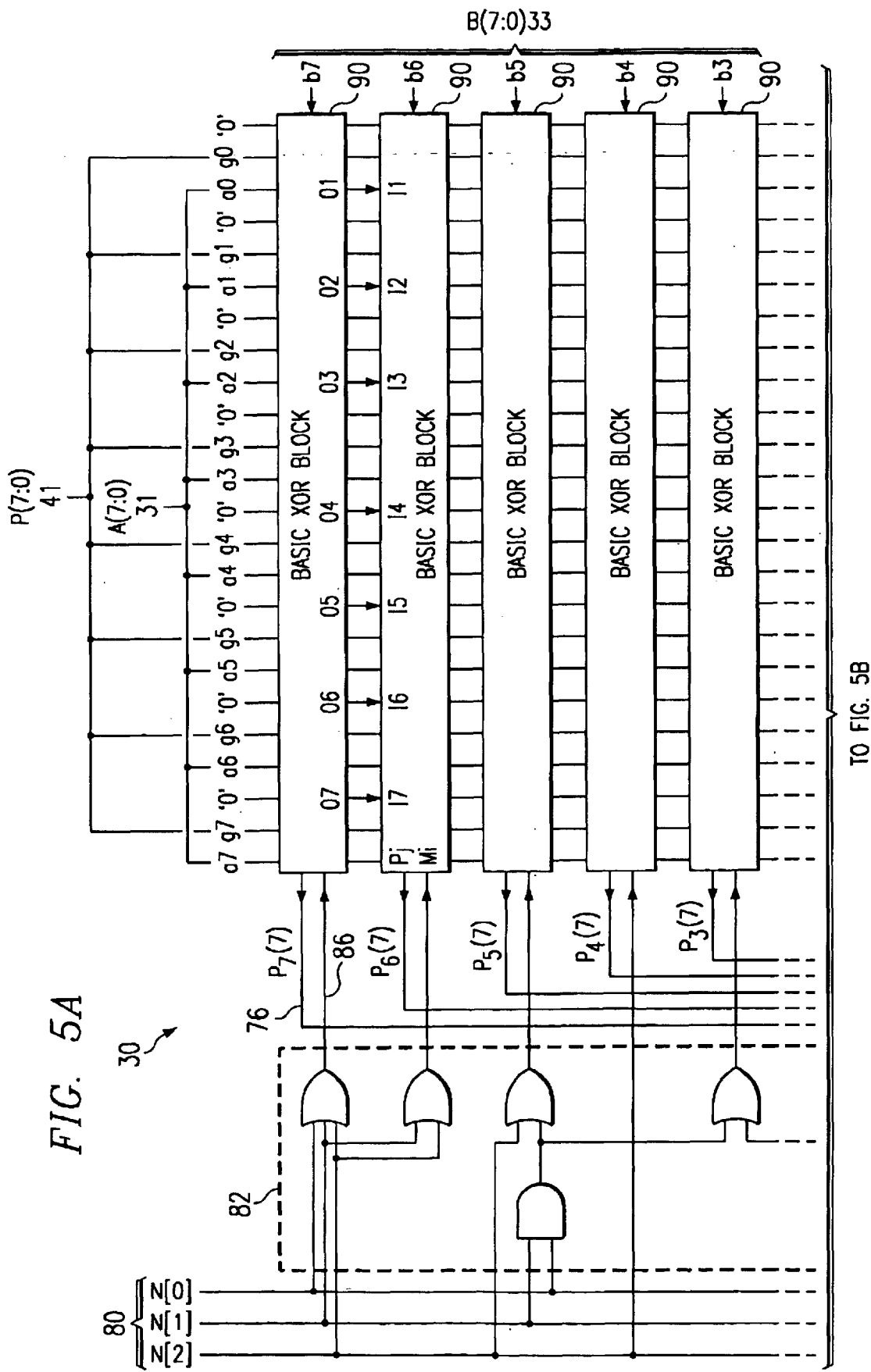
FIGS. 5A–5B illustrate the schematic diagram of the Galois field multiplier according to a preferred embodiment of the invention.
Figure 5B:
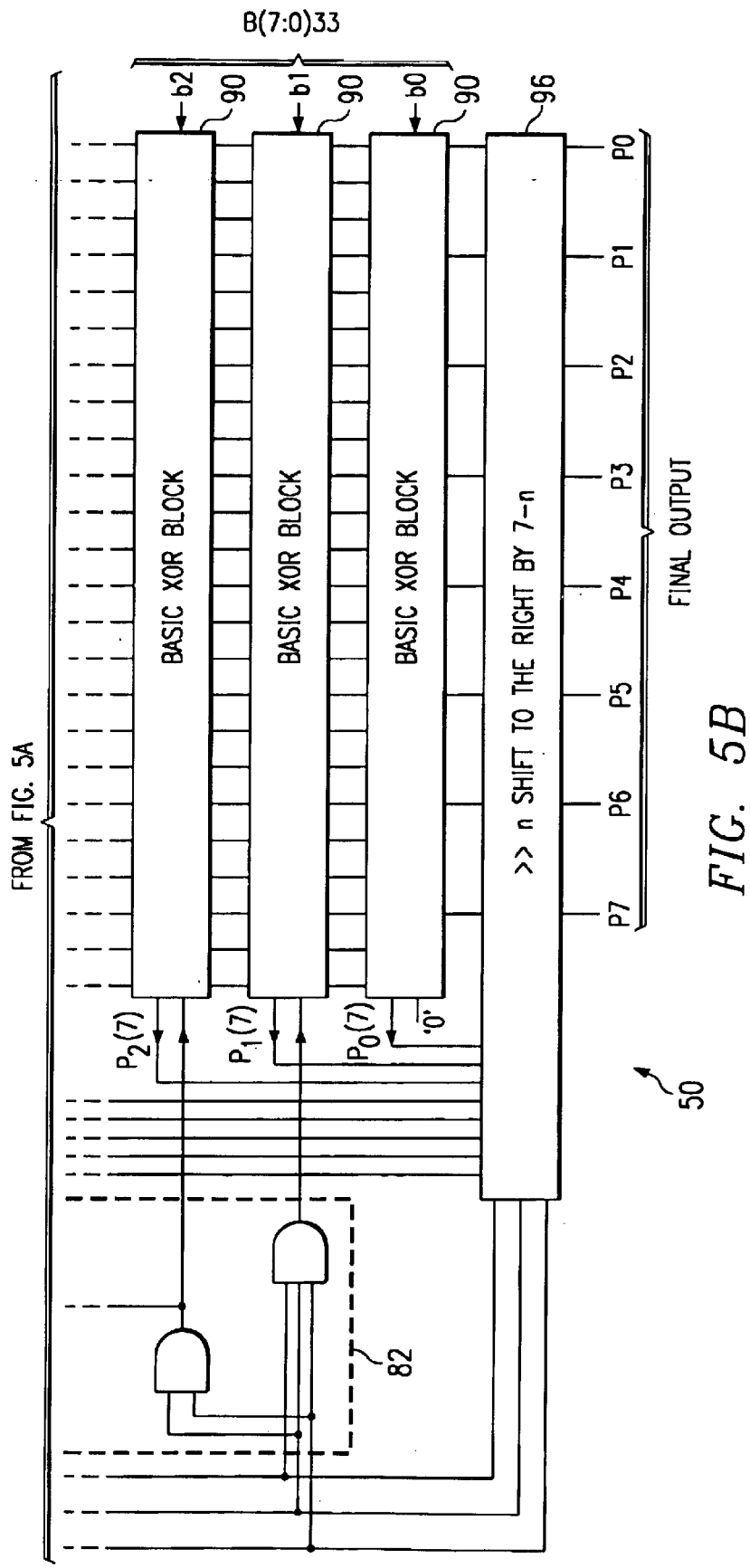

FIGS. 5A and 5B together are referred to as FIG. 5 and illustrate the schematic diagram of the Galois field multiplier 30 according to a preferred embodiment of the invention. According to the example of using a GF(256), the multiplier consists of eight BASIC XOR blocks 90 having the primitive polynomial, g(7:0) 41, input operand A, a(7:0) 31, and input operand B, b(7:0) 33 as inputs and O0–O7 91 as intermediate outputs. The intermediate outputs, O0–O7 91 form intermediate inputs, I0–I7 93 to the next BASIC XOR block 90 as illustrated both in FIG. 5 and even in more detail in FIG. 6. Multiplier 30 also has as inputs three binary bits N 0, N 1, and N 2 which form the field size 80 of the GF within which the multiplier is operating. These three field size bits can represent any size GF from GF(2)=N[000], to N[111]=GF(256). These three field size bits also, with the aid of mask circuitry 82, form mask input, $M_I$ 86 to BASIC XOR block 90 as illustrated in both FIGS. 5 and 6. This mask input $M_I$ 86, in dependence upon the particular Galois field size, determines whether an XOR with the primitive polynomial is to be performed in that associated BASIC XOR block 90, or not. A diagram illustrating the Galois field size and associated mask, $M_I$ 86 is shown in FIG. 7. The inputs, N[0], N[1], and N[2] 80 also form the inputs to shift circuitry 96, which in dependence upon the field size, shift the output bits O0–O7 91 to the right by (7−n), where n is the field size of the Galois field in binary. Invert the field size bits N1–N0 to determine the number of places you need to shift to the right. Therefore, the result of the multiplier in a Galois field size of GF(256) which has a field size of binary 7 (N[111]) would not be shifted at all, because 7−7=0 shift. On the other hand, the result of the multiplier in a Galois field size of GF(4), which has a field size of binary 2 (N[010]), would be shifted 7−2 or 5 bits to the right.

The logical components and configuration of a single BASIC XOR block 90 are illustrated in FIG. 6. As illustrated in FIG. 5, the inputs to the BASIC XOR block 90 are the primitive polynomial, g(7:0) 41, input operand A, a(7:0) 31, input operand B, $b_j$(7:0) 33 and intermediate signals I0–I7 93, which are the outputs, O0–O7 91 from the previous BASIC XOR block 90, and mask input, $M_I$ 86. Intermediate outputs O0–O7 91 result from each BASIC XOR block 90. The operation of each BASIC XOR block 90 is now described with reference to FIG. 6. Input operands a0–a7 31 polynomial multiply input operands b0–b7 33 in AND logic circuits 50. The outputs of AND logic circuit 50-7 forms intermediate products MSB $P_7$(7) 76. Intermediate product MSB 76 forms one input to a second set of AND logic gates 92 and also form an input to shift circuitry 96. The connection of $P_j$(7) 76 to the result of the multiplier is illustrated more clearly in FIG. 8. As shown, during the polynomial multiply of the two input operands 31,33, the partial products produce $P_7$(7)–$P_0$(7) which are the MSBs of the partial products and which, as illustrated in FIG. 5, form a portion of the final result of multiplier 30. Shifter 96 can have as many as fifteen bits comprising the output bits O0–O7 and the $P_j$(7) bits, especially if the partial products produce a MSB in every BASIC XOR block 90. The primitive polynomial g0–g7 41 form a second input to second AND logic gate 92 and the mask input, $M_I$ 86 forms the third and final input to second AND logic gate 92. This second AND gate 92 performs the division of the product $P_j$ 76 by the primitive polynomial g0–g7 41 in dependence upon the mask input, $M_I$ 86. Only if the mask input 86 is high, will the division occur. The output of second AND logic gates 92 forms the remainder and also forms a first input to XOR logic gate 94. The output of the previous BASIC XOR block, I1–I7 93 forms a second input to XOR logic gate 94, and the product of the next two input operand bits forms the third input $P_j$(6–0) to XOR logic gate 94.

For GF(256) multiplications, 7 BASIC XOR blocks 90 are required. For GF(128) multiplications, only 6 BASIC XOR blocks 90 are required. For GF(64) multiplications, only 5 BASIC XOR blocks 90 are required. This pattern is repeated for all the smaller Galois Fields. The key to allow a single implementation to perform for all different GF sizes is to store input operand B and operand A 31,33 and primitive polynomial PP 41 in memory such that the left most occupied bit of the operand 31,33 and primitive polynomial 41 fills the input MSB position, and to AND the mask bit to the conditional XORs, in dependence upon the size of the Galois field. Zeros may comprise a LSB portion of each input to the multiplier of the operands A and B 31,33 and primitive polynomial PP 41 in dependence upon the number of bits the primitive polynomial comprises as compared to the number of bits within the GF, as described in the above and following paragraphs and as shown in FIGS. 2, 3 and 5. The storing of the above-identified signals allows the design to contain 8 identical BASIC XOR blocks, with a single addition. For fields smaller than GF(256), the sequence of conditional XORs must be ANDed with the extra following mask as shown in FIG. 7. In addition, this design can operate on all fields with the exact same hardware with a minimum delay of just two XOR gates per block. In other words, the critical path of each BASIC XOR block is just 2 XOR gates.

FIG. 7 illustrates the different masks that must be ANDed to the sequence of conditional XORs in dependence on the size of the GF. In other words, instead of the MSB being a logical "1" determining that the result of the previous division by the primitive polynomial must be divided again by the primitive polynomial, according to a preferred embodiment of the invention, the mask illustrated in FIG. 7 determines whether the result of the primitive polynomial division must be divided by the primitive polynomial again. Each mask is different in dependence upon the size of the GF. This aspect of the invention is illustrated in FIGS. 8A and 8B. FIG. 8A illustrates a Galois field multiply of two 8 bit operands (GF($2^8$)). According to FIG. 7, the mask indicates that after the multiply of the two 8 bit operands, the primitive polynomial must divide the product 8 different times, i.e. the mask is 11111111, as is illustrated in FIG. 8A. In the code the field size is defined as required field size −1, i.e. m=7 corresponds to a GF ($2^8$), therefore the division only occurs 7 times. FIG. 8B illustrates a Galois field multiply of two 4 bit operands $GF(2^5)$. In this case, according to the mask illustrated in FIG. 7 for a GF size of $2^4$, the product created by the two 4 bit operands are divided by the primitive polynomial 4 times as illustrated in FIG. 8B.

The blocks described in FIGS. 1–6 were modeled in Very High Speed Integrated Circuit (VHSIC) Hardware Design Language (VHDL). The VHDL models were simulated with all possible combinations of A, B, GF, and p(x); and the results were verified against a C model. There are 687,424 possible combinations.

The VHDL models were synthesized using Texas Instruments' TSC5000ULV ASIC library. Synthesis experiments reveal this circuit to have a transistor count of approximately 1350 transistors with a critical path of 20 gates in TSC5000 with MAX parameters. The delay from GF or PP to the Y output is slightly larger but is not significant in view of in all applications, the GF and PP will remain constant for a specific RS encode or decode.

FIG. 9 illustrates the data flow diagram of a Galois field multiply instruction according to a preferred embodiment on the invention. It is anticipated that eight multipliers would be implemented which would accelerate the Reed Solomon algorithm by x4 of what can be attained in prior art Galois Field multipliers. In this example, using four multipliers, four eight bit by 8 bit products are generated in any dst from scr1 and src 2, as there is no growth in data as there is in a conventional multiply.

A second preferred embodiment entails 'flattening' the blocks. 'Flattening' a block is a way of combining all the smaller functional blocks into one large block and removing any redundant functions or replacing multiple functions with one larger more efficient function which could have a smaller area and/or smaller circuit delay.

The implementation according to a first and second embodiment of the invention as described in the above paragraphs is for Galois Fields 2, 4, 8, 16, 32, 64, 128, and 256. Additional GFs which have a power of two could be added. Also, several GFs could be removed to save area and/or reduce the circuit's critical delay. For example, GF(256) requires 8 bit operands and 7 BASIC XOR blocks 30. GF(128) requires 7 bit operands and 6 BASIC XOR blocks. Therefore, if one wants a design which does not operate on GF(256) operands, then one bit could be removed from all buses and one BASIC XOR block 30 could be deleted from the design. As another example, there are 25 primitive polynomials listed in Table 3. The block shown in FIG. 5 has AND functions for all 8 bits. Because all bits have these AND gates, all primitive polynomials with degrees 8 or less could be executed with this circuit. In addition, if an application wanted to reduce the number of primitive polynomials that the circuit could handle, any unused AND gates could be omitted. For example, as shown in FIG. 7, for GF(256), $p(x)=x^8+x^4+x^3+x^2+1$. Therefore, all AND gates with a zero can be removed. Also, the zeros applied to the XOR gates can also be removed. This design will be smaller by 10 gates. Again this could save area and/or reduce critical paths.

I claim:

1. A digital system having a Galois field multiplier for multiplying using any size Galois field in the range $GF(2^1)$ to $GF(2^n)$ and any corresponding primitive polynomial, the multiplier comprising:

an input to receive a field size indicator (m) of a selected Galois field, a multi-bit input to receive a selected primitive polynomial corresponding to the selected Galois field, and n-bit inputs to receive a first and second operand each comprising an m+1 bit Galois field symbol, wherein the Galois field symbols in the first and the second operands are aligned to the left most significant bit position (MSB) of the n-bit inputs;

n logic blocks coupled in series manner first to last, each logic block having a mask bit input, inputs to receive the primitive polynomial, inputs to receive the first operand, an input to receive a respective one bit of the second operand, intermediate inputs, and intermediate outputs for providing an intermediate result coupled to respective intermediate inputs of a next one of is the logic blocks, and an output for providing a partial product MSB;

mask circuitry connected to the field size indicator inputs and having a single different mask bit output connected to each of n logic blocks; and a shift circuit connected to receive a last intermediate result from the last logic block, and connected to receive each partial product MSB output in rank order, with an n-bit product output for providing a Galois field product symbol right shifted in response to the field size indicator, wherein the Galois field product symbol is aligned to the left most significant bit position of the n-bit product output.

2. The multiplier of claim 1, wherein the shift circuit is operable to right shift the rank ordered partial product MSBs and the last intermediate result by an amount equal to n minus m and to zero fill least significant bits (LSB) of the n-bit product output for Galois fields smaller than $GF(2^n)$.

3. The multiplier of claim 1, wherein the each of the n logic blocks comprises:

a first logic block connected to receive the first n-bit operand and the respective one bit of the second operand and being operable to AND the one bit of the second operand with each bit of the first operand to form a partial product, wherein the MSB of the partial product is connected to the partial product MSB output;

a second logic block connected to receive the primitive polynomial and operable to AND each bit of the primitive polynomial with the mask bit and the partial product MSB to form an n-bit remainder; and a third logic block connected to perform a bit-wise XOR on the n-bit remainder, an n-bit intermediate result from an immediately preceding logic block and n−1 bits of the partial product to form the intermediate result.

4. The system of claim 3, further comprising a memory block coupled to the multiplier for providing the first and second n-bit operands, wherein the m-bit Galois field symbols in the first and the second operands are aligned to the left most significant bit position (MSB) of the n-bit operands.

5. The system of claim 3, wherein n=8, and wherein the memory block is a 32-bit memory block, and wherein four first operands are stored in a single 32-bit memory word, and wherein the system comprises four Galois field multipliers coupled to receive a respective one of the four first operands in a parallel manner.

6. The system of claim 3, comprising an n-bit memory region coupled to the multiplier via an n-bit data bus, wherein the primitive polynomial is stored in the memory region, wherein the primitive polynomial is aligned to the left most significant bit position of the n-bit memory region.

7. A method for performing Galois field multiplication using any size Galois field in the range $GF(2^1)$ to $GF(2_n)$ and any applicable primitive polynomial, comprising the steps of:

selecting a Galois field having a field size m from a range of 0 to n−1, wherein Galois field symbols for the selected field have m+1 bits;

selecting a primitive polynomial that is valid for the selected Galois field size;

storing a first and second n-bit operand each containing a Galois field symbol in a memory region, wherein the Galois field symbols in the first and the second operands are aligned to the left most significant bit position (MSB) of the operands;

storing the primitive polynomial in a memory region such that the primitive polynomial is aligned to the left most significant bit position of the memory region;

combining the first and second operands to form n partial products, wherein each partial product has a most significant bit;

adding the n partial products together in an iterative manner to form n initial intermediate results;

selectively dividing each of the n initial intermediate results by the primitive polynomial in accordance with the field size and the most significant bit of the corresponding partial product to form a last intermediate result;

concatenating the most significant bit of each partial product in an ordered manner with the last intermediate result to form a raw product; and right shifting the raw product by an amount determined by the field size to form a product result comprising a Galois field symbol within the selected Galois field wherein the Galois field symbol is aligned to the left most significant bit position of the product result.

8. The method of claim 7, wherein the step of combining the first and second operands comprises the steps of:

bit-wise ANDing each bit of the first operand with a most significant bit of the second operand to form a first partial product; and repeating the step of bit-wise ANDing for each next less significant bit of the second operand to form the remaining n−1 partial products.

9. The method of claim 8, wherein the steps of adding and dividing comprise repeating for n iteration counts the steps of:

XORing the n−1 least significant bits of a current one of the n partial products with n−1 most significant bits of a previous n-bit intermediate result to form an n-bit tentative intermediate, result;

XORing the tentative intermediate result with the primitive polynomial only if the MSB of the current partial product has a first value and a current iteration count is less than or equal to m to form an intermediate result;

wherein during the first iteration, the previous intermediate result is a null value; and wherein the intermediate result of the last iteration is the last intermediate result.

10. The method of claim 7, further comprising the steps of:

receiving a continuous packed stream of Galois field symbols; and unpacking the packed stream to form a plurality of n-bit operands by filling n−(m+1) least significant bits of the operand with zeros.

11. A method for performing Galois field multiplication using any size Galois field in the range $GF(2^1)$ to $GF(2^n)$ and any applicable primitive polynomial, comprising the steps of:

selecting a Galois field having a field size m from a range of 0 to n−1, wherein Galois field symbols for the selected field have m+1 bits;

selecting a primitive polynomial that is valid for the selected Galois field size, wherein the primitive polynomial is aligned to the left most significant bit position;

combining a first and second n-bit operand each containing a Galois field symbol to form n partial products, wherein the Galois field symbols in the first and the second operands are aligned to the left most significant bit position (MSB) of the operands, and wherein each partial product has a most significant bit;

selectively dividing each of the n partial products by the primitive polynomial in accordance with the field size and the most significant bit of the corresponding partial product to form a last intermediate result;

concatenating the most significant bit of each partial product in an ordered manner with the last intermediate result to form a raw product; and right shifting the raw product by an amount determined by the field size to form a product result comprising a Galois field symbol from the selected Galois field wherein the Galois field symbol is aligned to the left most significant bit position of the product result.

12. The method of claim 11, wherein the step of combining the first and second operands comprises the steps of:

bit-wise ANDing each bit of the first operand with a most significant bit of the second operand to form a first partial product; and repeating the step of bit-wise ANDing for each next less significant bit of the second operand to form the remaining n−1 partial products.

13. The method of claim 11, wherein the step of dividing comprises repeating for n iteration counts the steps of:

XORing the n−1 least significant bits of a current one of the n partial products with n−1 most significant bits of a previous n-bit intermediate result to form an n-bit tentative intermediate result;

XORing the tentative intermediate result with the primitive polynomial only if the MSB of the current partial product has a first value and a current iteration count is less than or equal to m to form an intermediate result;

wherein during the first iteration, the previous intermediate result is a null value; and wherein the intermediate result of the last iteration is the last intermediate result.

* * * * *